US009356202B2

(12) United States Patent
Liu et al.

(10) Patent No.: US 9,356,202 B2
(45) Date of Patent: May 31, 2016

(54) WAVELENGTH CONVERTING MATERIAL AND APPLICATION THEREOF

(71) Applicant: Epistar Corporation, Hsinchu (TW)

(72) Inventors: Ru-Shi Liu, Taipei (TW); Chih-Ming Wang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/065,301

(22) Filed: Oct. 28, 2013

(65) Prior Publication Data

US 2014/0183583 A1  Jul. 3, 2014

(30) Foreign Application Priority Data

Oct. 30, 2012 (TW) .............................. 101140234 A

(51) Int. Cl.
| | |
|---|---|
| *H01L 33/50* | (2010.01) |
| *C09K 11/08* | (2006.01) |
| *C09K 11/77* | (2006.01) |
| *C09K 11/88* | (2006.01) |
| *H05B 33/14* | (2006.01) |

(52) U.S. Cl.
CPC .......... *H01L 33/502* (2013.01); *C09K 11/0883* (2013.01); *C09K 11/7706* (2013.01); *C09K 11/7731* (2013.01); *C09K 11/7734* (2013.01); *C09K 11/7769* (2013.01); *C09K 11/7774* (2013.01); *C09K 11/88* (2013.01); *H05B 33/14* (2013.01); *Y10T 428/2982* (2015.01)

(58) Field of Classification Search
CPC  H01L 33/502; H01L 33/504; C09K 11/0883; C09K 11/7706; C09K 11/7731
See application file for complete search history.

(56) References Cited

U.S. PATENT DOCUMENTS

| | | | |
|---|---|---|---|
| 2004/0104391 A1* | 6/2004 | Maeda et al. | 257/79 |
| 2006/0091403 A1* | 5/2006 | Chang et al. | 257/79 |
| 2010/0133989 A1* | 6/2010 | Stiles et al. | 313/504 |

OTHER PUBLICATIONS

Yang et al., "Characterization and Luminescence Properties of YAG: Ce3+ Phosphors by Molten Salt Synthesis", The American Ceramic Society, 2011, 3 pages.

* cited by examiner

*Primary Examiner* — Tucker J Wright
(74) *Attorney, Agent, or Firm* — Ditthavong & Steiner, P.C.

(57) ABSTRACT

This disclosure discloses a wavelength converting material. The wavelength converting material comprises a plurality of wavelength converting particles, the wavelength converting particles having an average particle size greater than 5 μm, and wherein each of the wavelength converting particles has a particle size. 90% of the wavelength converting particles have the particle size smaller than a μm; 50% of the wavelength converting particles have the particle size smaller than b μm; and 10% of the wavelength converting particles have the particle size smaller than c μm; wherein $(a-c)/b \leq 0.5$.

9 Claims, 3 Drawing Sheets

WAVELENGTH CONVERTING MATERIAL AND APPLICATION THEREOF

BACKGROUND

1. Technical Field

The present disclosure relates to a wavelength converting material, and in particular to wavelength converting particles with a uniform size distribution.

2. Reference to Related Application

This application claims the right of priority based on TW application Serial No. 101140234, filed on Oct. 30, 2012, and the contents of which are hereby incorporated by reference in its entirety.

3. Description of the Related Art

The light-emitting diodes (LEDs) of the solid-state lighting elements have the characteristics of low power consumption, low heat generation, long operational life, shockproof, small volume, quick response and good opto-electrical property like light emission with a stable wavelength so the LEDs have been widely used in household appliances, indicator light of instruments, and opto-electrical products, etc.

Recently, a technology has been developed to convert the light emitted from a light-emitting diode (LED) into another light. For example, a phosphor layer is used to cover the light-emitting diode for realizing this technology. The phosphor layer is photoluminescence substance and can absorb a first light emitted from the LED to emit a second light different from the first light. The first light and the second light are mixed to form a desired color. However, phosphor particles with different sizes have different light efficiency, thereby affecting the overall light efficiency of the LED.

In addition, the LED can be further connected to other components in order to form a light emitting apparatus. The LED comprises a substrate mounted onto a submount. Alternatively, a solder bump or a glue material may be formed between the submount and the LED, therefore a light-emitting apparatus is formed. Besides, the submount further comprises the circuit layout electrically connected to the electrode of the LED.

SUMMARY OF THE DISCLOSURE

The present disclosure provides a wavelength converting material.

The wavelength converting material comprises: a plurality of wavelength converting particles, the wavelength converting particles having an average particle size greater than 5 μm, and wherein each of the wavelength converting particles has a particle size; wherein 90% of the wavelength converting particles have the particle size smaller than a μm; 50% of the wavelength converting particles have the particle size smaller than b μm; and 10% of the wavelength converting particles have the particle size smaller than c μm; wherein $(a-c)/b \leq 0.5$.

The present disclosure also provides a light-emitting device.

The light-emitting device comprises: a light-emitting stack emitting a first light with a peak wavelength; and a wavelength converting material having plurality of wavelength converting particles and formed on the light-emitting stack for absorbing the first light to emit a second light with a peak wavelength different that of the first light; wherein each of the plurality of wavelength converting particles has a particle size, and the wavelength converting particles have an average particle size greater than 5 μm, and wherein 90% of the wavelength converting particles have the particle size smaller than a μm; 50% of the wavelength converting particles have the particle size smaller than b μm; and 10% of the wavelength converting particles have the particle size smaller than c μm; wherein $(a-c)/b \leq 0.5$.

BRIEF DESCRIPTION OF THE DRAWING

The accompanying drawing is included to provide easy understanding of the application, and is incorporated herein and constitutes a part of this specification. The drawing illustrates the embodiment of the application and, together with the description, serves to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure in accordance with the drawings.

Figure 1:
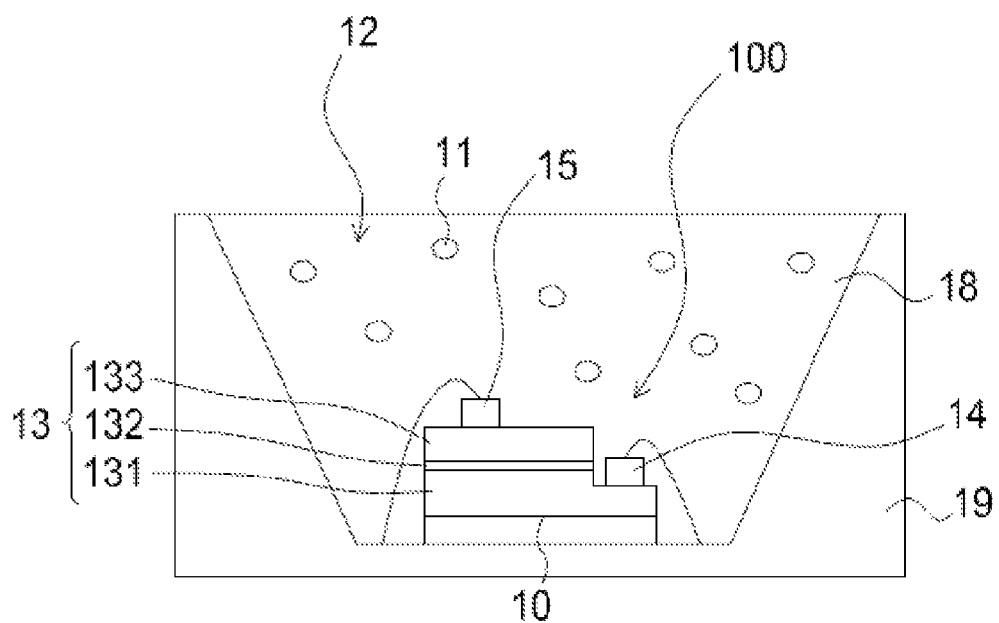
FIG. 1 shows a cross-sectional view of a light-emitting device in accordance with the first embodiment of the present disclosure.

FIG. 1 discloses a light-emitting device 100 in accordance with the first embodiment of the present disclosure. The light-emitting device 100 comprises a substrate 10, and a light-emitting stack comprising a first-type semiconductor layer 131, an active layer 132 formed on the first-type semiconductor layer 131 and emitting a first light with a peak wavelength, and a second-type semiconductor layer 133 formed on the active layer 132. The first-type semiconductor layer 131 and the second-type semiconductor layer 133 respectively provide electrons and holes such that electrons and holes can be combined in the active layer 132 to emit light. The light-emitting device 100 further comprises a first electrode 14 formed on the first-type semiconductor layer 131 and a second electrode formed on the second-type semiconductor layer 133. As shown in FIG. 1, the light-emitting device 100 is a horizontal-type structure, but it also can be a vertical-type structure or other-type structure. The light-emitting device 100 is mounted on a cup 19 and a wavelength converting material 12 fills the cup 19. In this embodiment, the wavelength converting material 12 is formed on the light-emitting stack 13 and comprises a plurality of wavelength converting particles 11 dispersed within a transparent material 18 for absorbing the first light to emit a second light with a peak wavelength different that of the first light. The transparent material 18 comprises epoxy or silicone.

Figure 2A:
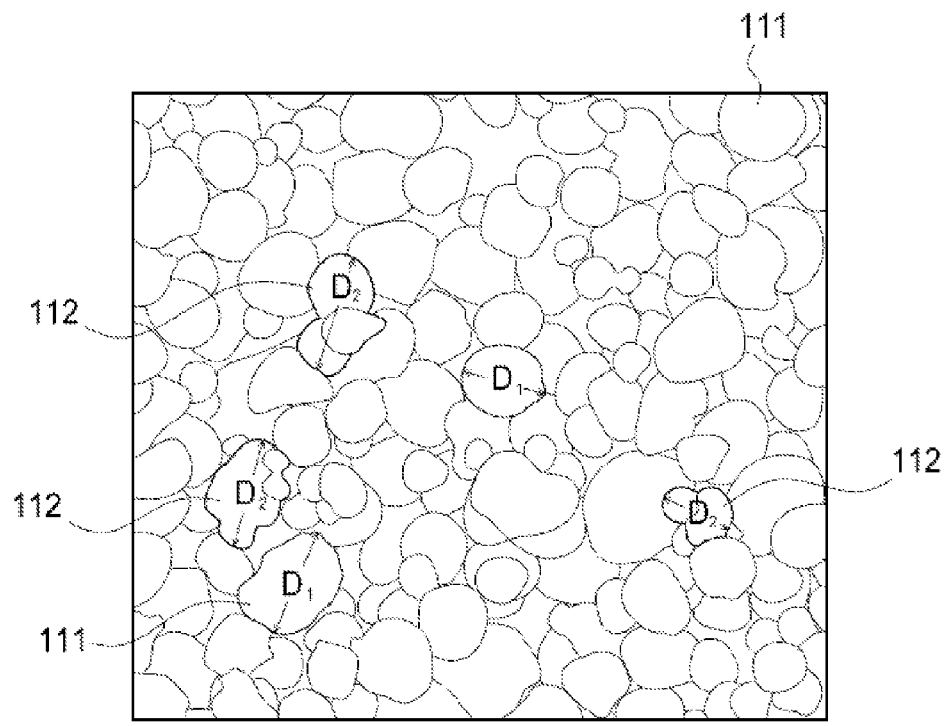
FIG. 2A shows a perspective view of a wavelength converting material.
Figures 2B, 2C, 2D:
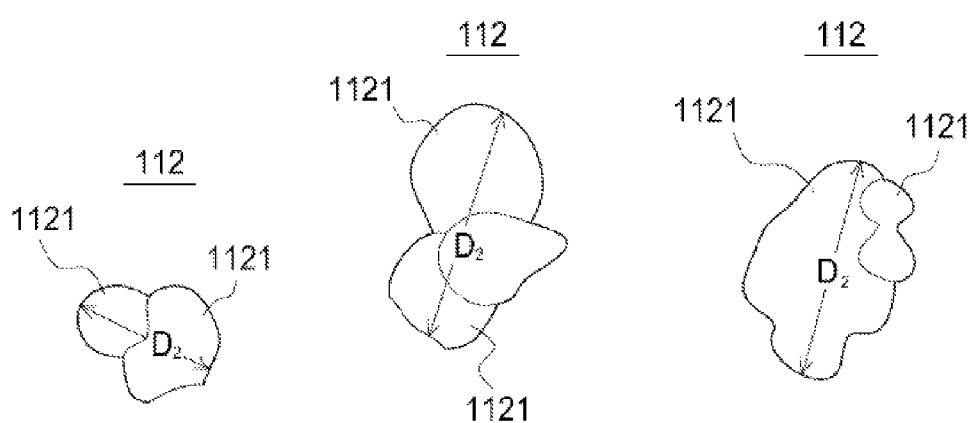
FIGS. 2B-2D shows a perspective view of a second-type particles with different type.

As shown in FIG. 2A, the wavelength converting particles 11 comprises a plurality of first-type particles 111 and a plurality of second-type particles 112. Each of the first-type particles 111 has a first particle size ($D_1$), and in one embodiment, an average of the particle size of the first-type particles 111 is greater than 5 μm and smaller than 20 μm. In this embodiment, the first-type particles 111 comprise a single particle observed by human eye or instruments and have a shape of circle, oval, or irregular shape. Compared to the first-type particles 111, the second-type particles 112 comprise a plurality of aggregated and inseparably particles observed by human eye or instruments and have a shape of circle, oval, or irregular shape. The term "inseparably" indicates the aggregated particles cannot be separated by separation method, for example, sieving, water law, cyclone separation, or sedimentation. Each of the second-type particles 112 has a second particle size ($D_2$), and in one embodiment, an average of the particle size of the first-type particles 111 is greater than 5 µm and smaller than 20 µm. When a plurality of particles is aggregated together to form a second-type particle 112, the second particle size ($D_2$) is defined by a measured maximum length. FIGS. 2B and 2D show the second-type particle 112 with different type. 90% of the wavelength converting particles have a particle size smaller than a µm; 50% of the wavelength converting particles have a particle size smaller than b µm; and 10% of the wavelength converting particles have a particle size smaller than c µm; wherein $(a-c)/b \leq 0.5$. The particle size can be the first particle size or/and the second particle size. Specifically, a particle size (including the first particle size or/and the second particle size) of each of the wavelength converting particles is measured to obtain the wavelength converting particles with a size distribution which is arranged from lowest value to highest value. Once a particle is numbered from the lowest value up to the number of 90% total particles, the size of the particle is substantially defined as a µm. Likewise, when a particle is numbered from the lowest value up to the number of 50% total particles, the size of the particle is substantially defined as b µm. When a particle numbered from the lowest value up to the number of 10% total particles the size of the particle is substantially defined as c µm. In one embodiment, $0.1 \leq (a-c)/b \leq 0.5$. In another embodiment, the amount of the first-type particle 111 is about greater than 70% of the wavelength converting particles.

It is noted that when the first light emitted from the light-emitting device passes through wavelength converting particles with different size, a light intensity of the second light, for example, photoluminescence (PL) is different. The smaller the size of the wavelength converting particle, the lower the light intensity of the second light is. On the contrary, the wavelength converting particle having a bigger size emits the second light with a higher light intensity. In this embodiment, the wavelength converting particles have a first portion and a second portion and a ratio of the light intensity ($PL_1$) of the first portion to that of the second portion is not greater than 10%.

Figure 3A:
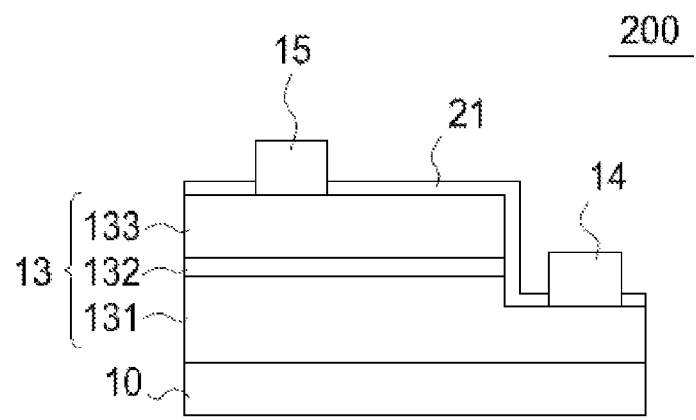
FIG. 3A shows a cross-sectional view of a light-emitting device in accordance with the second embodiment of the present disclosure.

FIG. 3A disclose a light-emitting device 200 in accordance with the second embodiment of the present disclosure. The light-emitting device 200 of the second embodiment has a structure similar than the light-emitting device 100 of the first embodiment, except that the wavelength converting material 21 is directly formed on the light-emitting stack 13. The first electrode 14 and the second electrode are respectively formed on the first-type semiconductor layer 131 and the second-type semiconductor layer 133.

Figure 3B:
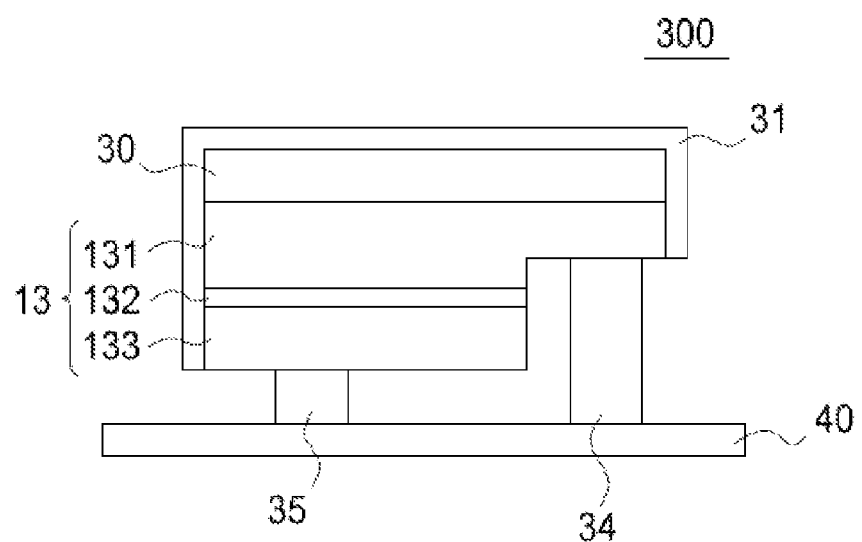
FIG. 3B shows a cross-sectional view of a light-emitting device in accordance with the third embodiment of the present disclosure.

FIG. 3B disclose a light-emitting device 300 in accordance with the third embodiment of the present disclosure. The light-emitting device 300 of the third embodiment has a structure similar with the light-emitting device 100 of the first embodiment. The light-emitting device 300 is in a flip-chip form. The light-emitting stack 13 is formed on a transparent substrate 30, and the first electrode 34 and the second electrode 35 are respectively formed on the first-type semiconductor layer 131 and the second-type semiconductor layer 133. The first electrode 34 and the second electrode 35 are electrically connected to a carrier 40 in a flip-chip form. The wavelength converting material 31 is directly formed on transparent substrate 30 and covering a sidewall of the light-emitting stack 13.

The wavelength converting material is selected from one of the group consisting of $Y_3Al_5O_{12}$, $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:Eu, (Ca,Sr)S:(Eu,Mn), (Ca,Sr)S:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, CdZnSe, and combinations thereof.

The first-type semiconductor layer can be an n-type semiconductor layer and the second-type semiconductor layer can be a p-type semiconductor layer. The first-type semiconductor layer and the second-type semiconductor layer is one selected from the group consisting of AlGaAs, AlGaInP, AlInP and InGaP, or one selected from the group consisting of AlInGaN, InGaN, AlGaN and GaN. Alternatively, the first-type semiconductor layer can be a p-type semiconductor layer and the second-type semiconductor layer can be an n-type semiconductor layer. The active layer is selected from one of the group consisting of AlGaAs, AlGaInP, AlInP and InGaP, or one of the group consisting of AlInGaN, InGaN, AlGaN and GaN. The substrate comprises GaAs, GaP, Ge, sapphire, glass, diamond, SiC, Si, GaN, or ZnO.

The foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A wavelength converting material, comprising:
a plurality of wavelength converting particles comprising a plurality of single particles and a plurality of aggregated particles;
wherein only 90% of the plurality of wavelength converting particles is smaller than a µm; only 50% of the plurality of wavelength converting particles is smaller than b µm; only 10% of the plurality of wavelength converting particles is smaller than c µm; and $(a-c)/b \leq 0.5$.

2. The wavelength converting material of claim 1, wherein $0.1 \leq (a-c)/b \leq 0.5$.

3. The wavelength converting material of claim 1, wherein the plurality of single particles has an average particle size greater than 5 µm.

4. The wavelength converting material of claim 1, wherein the plurality of aggregated particles has an average particle size greater than 5 µm.

5. The wavelength converting material of claim 1, wherein more than 70% of the plurality of the wavelength converting particles belongs to the plurality of the single particle.

6. The wavelength converting material of claim 1, wherein the plurality of wavelength converting particles has an average particle size which is greater than 5 µm and smaller than 20 µm.

7. The wavelength converting material of claim 1, wherein the plurality of wavelength converting particles is selected from the group consisting of $Y_3Al_5O_{12}$, $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:

Eu, (Ca,Sr)S:(Eu,Mn), (Ca,Sr)S:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, CdZnSe, and a combination thereof.

8. A light-emitting device, comprising:
- a light-emitting stack configured to emit a first light with a first peak wavelength; and
- a wavelength converting material having a plurality of wavelength converting particles and formed on the light-emitting stack for absorbing the first light and emitting a second light with a second peak wavelength different from the first peak wavelength;
- wherein the plurality of wavelength converting particles comprises a plurality of single particles and a plurality of aggregated particles,
- wherein only 90% of the plurality of wavelength converting particles is smaller than a μm; only 50% of the plurality of wavelength converting particles is smaller than b μm; and 10% of the plurality of wavelength converting particles is smaller than c μm; and $(a-c)/b \leq 0.5$.

9. The light-emitting device of claim 8, wherein the plurality of wavelength converting particles is dispersed in a transparent material.

\* \* \* \* \*